US006441482B1

(12) United States Patent
Foster

(10) Patent No.: US 6,441,482 B1
(45) Date of Patent: Aug. 27, 2002

(54) BIOMETRIC DEVICE WITH INTEGRATED CMOS IMAGE SENSOR

(75) Inventor: Ronald R. Foster, Los Gatos, CA (US)

(73) Assignee: Omnivision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/546,838

(22) Filed: Apr. 11, 2000

(51) Int. Cl.[7] ................... H01L 23/34; H01L 31/062; H01L 29/00
(52) U.S. Cl. .................. 257/724; 257/291; 257/530
(58) Field of Search ................. 257/291, 530, 257/678, 723, 724

(56) References Cited

U.S. PATENT DOCUMENTS

| 4,475,158 A | * 10/1984 | Elias ................... 364/413 |
| 4,589,028 A | 5/1986 | Ochi |
| 5,198,880 A | 3/1993 | Taguchi et al. |
| 5,574,789 A | 11/1996 | Nakamura et al. |
| 5,841,126 A | 11/1998 | Fossum et al. |
| 5,912,483 A | 6/1999 | Hamada |
| 6,021,172 A | 2/2000 | Fossum et al. |
| 6,028,773 A | * 2/2000 | Hundt ................... 361/760 |
| 6,104,059 A | 8/2000 | Ono |
| 6,141,243 A | 10/2000 | Aslam et al. |

FOREIGN PATENT DOCUMENTS

| DE | 3733074 A1 | 9/1997 |
| EP | 0942594 A2 | 9/1999 |
| JP | 04112551 | 1/1992 |

OTHER PUBLICATIONS

Murray, A.F. et al.; A User's Guide to Non–volatile, On–Chip Analogue Memory; Electronics & Communication Engineering Journal; Apr. 1998.
Anderson, S.; A Single Chip Sensor & Image Processor for Fingerprint Verification; Custom Integrated Circuits Conference; May 12–15, 1991; San Diego, CA, USA.
Aslam–Sidiqi, Amer et al.; A 128–Pixel CMOS Image Sensor with Integrated Analog Nonvolatile Memory; IEEE Journal of Solid–State Circuits; vol. 33; No. 10; Oct. 1998.
Calligaro, Cristiano et al.; A High–Speed Parallel Sensing Scheme for Multi–Level Non–Volatile Memories; IEEE, 1997.
Miura, Hiroki, A 100Frame/s CMOS Active Pixel Sensor for 3D–Gesture Recognition System; Internatioal Solid–State Circuits Conference; Feb. 16, 1999.

* cited by examiner

Primary Examiner—Ngân V. Ngô
(74) Attorney, Agent, or Firm—Perkins Coie LLP

(57) ABSTRACT

A biometric device formed on an integrated circuit is disclosed. The biometric device includes a CMOS image sensor, a microprocessor, and non-volatile memory.

8 Claims, 2 Drawing Sheets

BIOMETRIC DEVICE WITH INTEGRATED CMOS IMAGE SENSOR

TECHNICAL FIELD OF THE INVENTION

The present invention relates to biometric devices, and more particularly, to a biometric device having a CMOS image sensor formed on the same integrated circuit.

BACKGROUND OF THE INVENTION

Integrated circuit technology has revolutionized various fields, such as imaging. In the field of imaging, the development of a CMOS image sensor has made possible the manufacture of low cost imaging devices. One advantage of the CMOS image sensor device is the ability to integrate signal processing logic (typically formed in a CMOS process) with the sensing array to form a single chip CMOS image sensor. The signal processing logic is used to readout the data from the sensing array, amplify the signals from the sensing array, provide timing and control functions, and any other required functions of the CMOS image sensor.

One application of CMOS image sensors is in the field of biometrics. Biometrics is generally the automatic identification of a person's identity by measurement of a unique physical characteristic by electronic means. Typical biometric systems use digitized images of fingerprints, iris patterns in the eye, hand shape, or hand vein patterns as a basis for identity verification.

Present biometric systems consist of several separate integrated circuits. One of the integrated circuits is dedicated to capturing image data, for example, a CCD image sensor or a CMOS image sensor. The captured image data is used for comparison with previously captured and distilled image data stored in a separate integrated circuit memory device. The comparison may be done using a signal processor or microprocessor formed on yet another integrated circuit. In some biometric systems, the signal processor or microprocessor may be integrated with a memory device. In any event, at least two separate integrated circuits are required for the biometric system.

Typically, after the image data is captured, the image data is processed in such a way as to reduce the amount of data necessary to perform a subsequent pattern matching step. The reduced data set or "template" may also be stored for later use.

While some applications of biometric systems must address a large number of individuals and involves large databases of users, many other applications need only address a single or small number of individuals. Examples of such systems are home access locks, personal computer access control, adult media content access, firearm access, etc. . . . In these applications, it is important that the biometric device be made as small as possible. Therefore, multiple integrated circuits are undesirable.

Additionally, if the biometric system can be made small enough, the biometric systems would find new applications, such as theft deterrence. For example, a product that contains a biometric device could be used to trigger the destruction of sensitive data or destroy circuitry within the product itself. Destruction would be activated by multiple failed attempts to gain access or use of the product, thereby rendering the product of little or no value to the would be thief.

SUMMARY OF THE INVENTION

A biometric device formed on an integrated circuit is disclosed. The biometric device includes a CMOS image sensor, a microprocessor, and non-volatile memory.

DETAILED DESCRIPTION

Biometric systems begin with the measurement of a physiological characteristic. Key to all biometric systems is the underlying assumption that the measured biometric characteristic is both distinctive between individuals and repeatable over time for the same individual. The user's characteristic, such as a fingerprint or iris pattern, must be illuminated with an illumination system and presented to an image sensor. The output of the image sensor is the biometric measure that forms the distinctiveness of the measurement.

In its simplest form, a biometric device acts as an authentication device that compares received data to stored data. The biometric device is typically integrated with an associated apparatus. If the received data matches the stored data, the biometric device will provide a signal to its associated apparatus to "unlock" or otherwise allow access. If the received data does not match the stored data, then the biometric device will not "unlock" the associated apparatus. In some cases, as noted above, the biometric device will send a signal to the associated apparatus to destroy some portion of the data in its associated apparatus.

Figure 1:
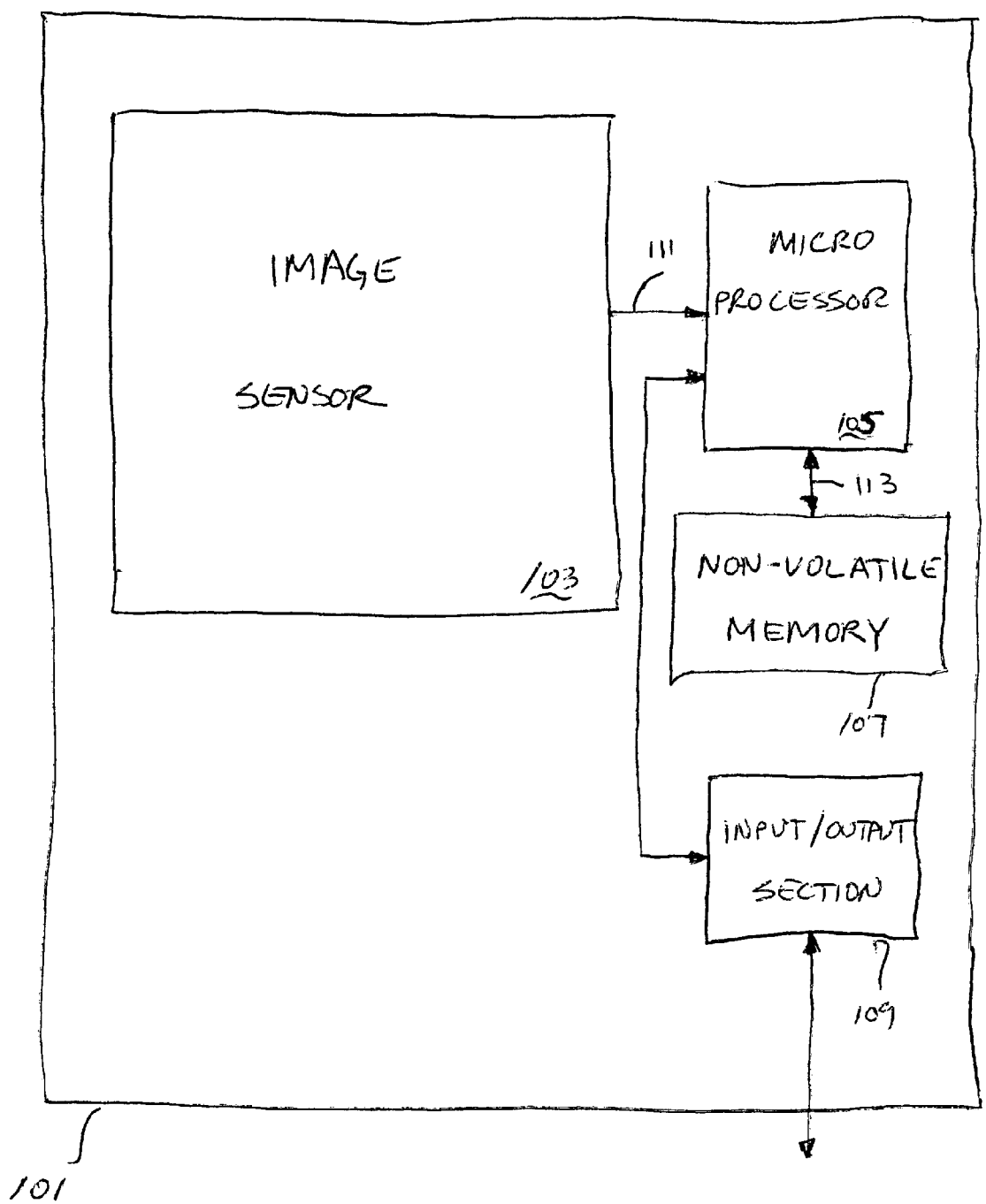
FIG. 1 is a schematic diagram of a biometric device formed in accordance with the present invention.

FIG. 1 illustrates a biometric device 101 formed in accordance with the present invention. Preferably, the biometric device 101 is formed in a standard CMOS process. The biometric device includes a CMOS image sensor 103, a microprocessor 105, non-volatile memory 107, and an input/output section 109.

The CMOS image sensor 103 includes a plurality of individual pixels arranged in a two-dimensional array. The CMOS image sensor 103 may be formed in accordance with the designs of the products manufactured by OmniVision Technologies, Inc., the assignee of the present invention. Currently, the prior art CMOS image sensor products of OmniVision Technologies are stand alone products. However, those skilled in the art with the benefit of this disclosure can take the CMOS image sensor designs of the prior art and incorporate them in the biometric device 101 of the present invention.

The biometric device 101 also includes microprocessor 105. The microprocessor 105 is the portion of the biometric device 101 that executes the instructions necessary to perform the biometric function. The microprocessor 105 is a conventional device that can execute a set of preprogrammed instructions. The design of the microprocessor 105 may be obtained from any number of companies that provide embedded microprocessor cores.

The microprocessor 105 receives the raw image data from the image sensor 103 via a first bus 111. As will be seen below, the microprocessor 105 will then perform some form of data reduction on the raw image data to extract a feature set.

The feature set extraction process is a form of data compression. The original raw data image typically cannot be reconstructed from the feature set. However, the feature set relates nearly uniquely to a particular individual. A feature set extraction process should deconvolve from the raw image data the true biometric pattern and not the image or sensor characteristics. Second, the feature set should preserve those qualities of the raw image data that are distinctive and repeatable, and discard those qualities that are not distinctive and repeatable.

The microprocessor 105 is also communicatively connected to nonvolatile memory 107 via a second bus 113. The non-volatile memory 107 is used to store the template that, when matched to a feature set extracted from the raw image data, will cause the biometric device 101 to send a control signal through the input/output section 109 to "unlock" an associated apparatus connected to the biometric device 101. Thus, input/output portion 109 is used by the biometric device 101 to communicate with its associated apparatus.

In the preferred embodiment, the non-volatile memory 107 is formed from flash memory. It can be appreciated that there are various other types of field programmable non-volatile memory that may be used, such as PROM, EPROM, EEPROM, and anti-fuse technology memory. Anti-fuse technology may be useful in cases where only a one-time programming of the non-volatile memory 107 is required.

Moreover, the non-volatile memory 107 may be used to store other types of information not specifically related to the biometric function. For example, the non-volatile memory 107 may be used to store information relating to the operation of the CMOS image sensor 103 and pixel defect correction data for the CMOS image sensor 103.

The non-volatile memory 107 can be programmed using the input/output section 109. This approach may be preferred or even mandated where the biometric device 101 is integrated with an associated apparatus that is highly regulated, such as a firearm. In that instance, it may be desirable for the non-volatile memory 107 of the biometric device 101 to be programmed at the point of sale or point of governmental licensing.

If the non-volatile memory 107 is to programmed using the input/output section 109, then conventional methods can be used. For example, conventional programming machinery may be used to apply programming signals to the non-volatile memory 107. The programming signals are obtained by taking a measurement (by imaging) of one or more physiological characteristics, performing a predetermined data reduction of the measurement to derive the template. This template is then stored into the non-volatile memory 107.

Alternatively, the non-volatile memory 109 may be programmed by the microprocessor 105. This method may be preferred when the biometric device 101 is used with certain types of devices that may require multiple reprogrammings. In this method, the biometric device 101 is used as the means by which the data to be stored in the non-volatile memory is received. The user, upon input of appropriate control signals to the microprocessor 105 via the input/output section 109, may indicate that the next input to the biometric device 101 will be a "programming input". In the preferred embodiment, the input/output section 109 is connected to an input device, such as a keypad, touchscreen, or the like. The user can then use the input device to control the microprocessor 105.

When the microprocessor 105 is informed that the next input from the image sensor 103 will be a programming input, the microprocessor 105 will process the programming input and store it within the non-volatile memory 107.

The process described above where the template is stored into the non-volatile memory 107 is called the enrollment process. In this process, the biometric device is "taught" who an authorized user is and the physiological characteristics of the authorized user.

The operation of the biometric device 101 will now be described in connection with FIG. 2. As an overview, the microprocessor 105 is programmed to obtain raw image data, process the raw image data to extract a feature set, compare the extracted feature set with the template stored in the non-volatile memory 107, and make a decision based upon the comparison.

Figure 2:
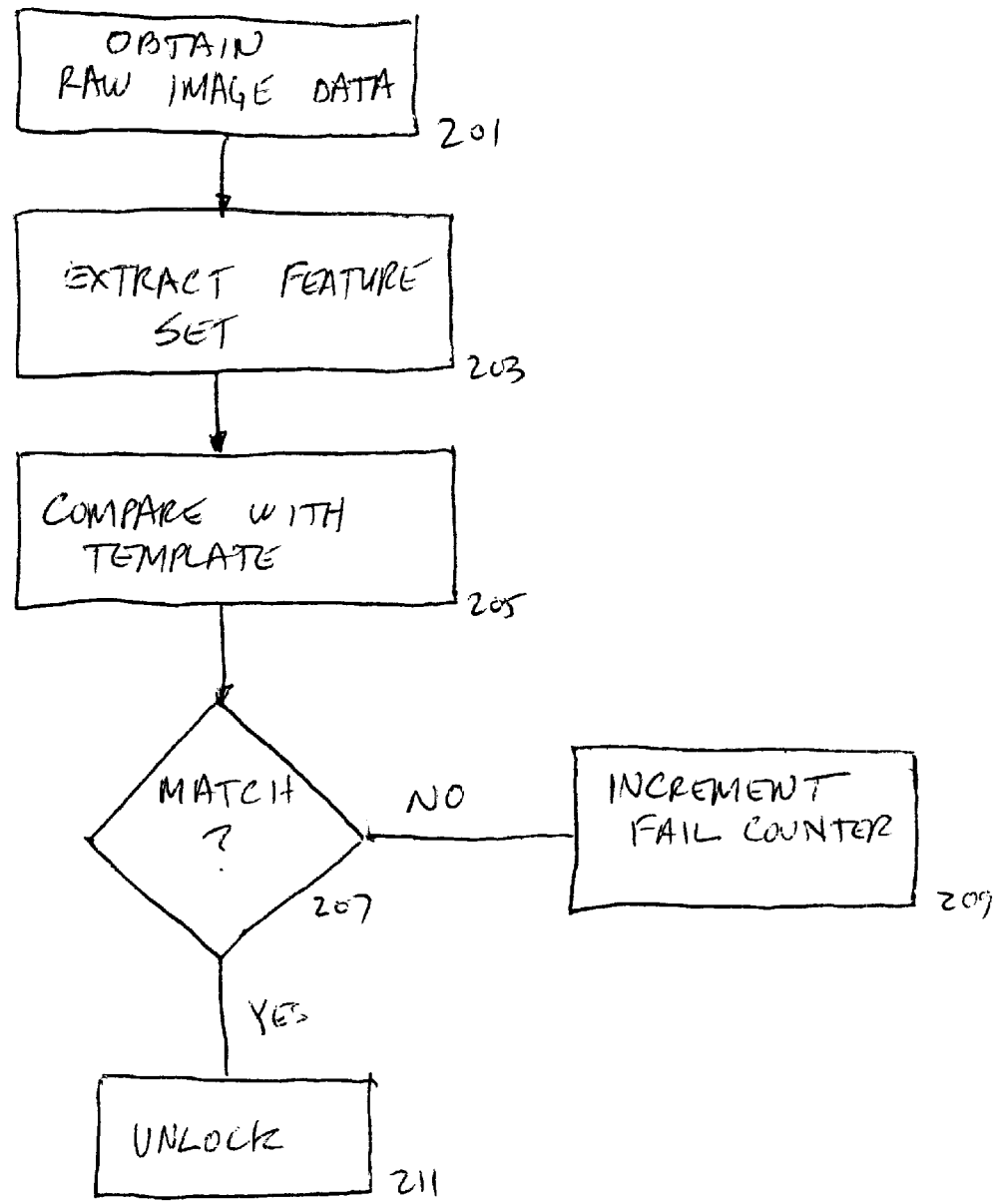
FIG. 2 is a flow diagram illustrating the operation of the biometric device of FIG. 1.

Specifically, at step 201 of FIG. 2, the raw image data is obtained using a light source to illuminate the physiological characteristic of a candidate user and the CMOS image sensor 103 to capture the raw image data. Next, at step 203, the microprocessor 105 acts on the raw image data to extract a feature set. The precise method used to extract the feature set is dependent upon the specific physiological characteristic being measured and will vary according to the specific application of the biometric device 101. However, it is important that the method used to extract the feature set be substantially similar to the method used to derive the template stored in the non-volatile memory 107 during the programming process.

Next, at step 205, the microprocessor 105 performs a comparison between the extracted feature set with the template stored in the nonvolatile memory 107. After the comparison, a determination is made at step 207 as to whether or not a match exists. The determination of a match relies upon the use of statistical metrics. Rarely will the extracted feature set match exactly with the template, due to environmental, physiological, and other variations. Therefore, the feature set should be "close enough" to the template by a predetermined threshold.

What constitutes "close enough" will vary with the particular application of the biometric device. The designer must balance the occurrence of false negatives with the occurrence of false positives. For example, in high security applications, the number of false positives should be extremely low. This corresponds to requiring a close match between the extracted feature set and the template in the non-volatile memory 107.

If a match is determined at step 207, then at step 211, the microprocessor 105 issues an "unlock" command for output by the input/output section 109. If, however, a match is not found, then at step 209 of this embodiment, a fail counter stored in the microprocessor 105 is incremented. In alternative embodiments, if a match is not found, then the microprocessor 105 will simply not issue the unlock command.

The fail counter is preferable if the biometric device 101 wishes to keep track of the number of failed access attempts. As noted previously, in some applications, if the fail counter is above a predetermined number, the microprocessor 105 may be programmed to take some destructive or alarm action.

The preferred embodiment described above has discussed the storage of a single template in the non-volatile memory 107. In many applications, the non-volatile memory 107 may store multiple templates. In such a case, the step of comparing shown in FIG. 2 will be done for each of the templates.

Thus, while the preferred embodiment of the invention has been illustrated and described, it will be appreciated that various changes can be made therein without parting from the spirit of scope of the invention. The current invention has been described in relation to a preferred embodiment. One of ordinary skill after reading the foregoing specification will be able to affect various changes, alterations, and substitutions or equipment without departing from the broad concepts disclosed. For example, although the preferred embodiment has described a method wherein the raw image data captured by the CMOS image sensor 103 is processed to extract a feature set, this step may not be necessary, if the non-volatile memory 107 is of sufficient size and/or the microprocessor 105 is of sufficient processing power to deal with the full raw image data. It is therefore intended that the scope with the Letters Patent granted hereon be limited only by the definition contained in the affirmative claims and the equivalents thereon, and not by limitations of the embodiments described herein.

The embodiments of the invention of which an exclusive right or privilege is claimed are defined as follows:

1. A biometric device formed on an integrated circuit, said biometric device including a CMOS image sensor formed on said integrated circuit, a microprocessor formed on said integrated circuit, and non-volatile memory formed on said integrated circuit.

2. The biometric device of claim 1 wherein said non-volatile memory is an anti-fuse programmable read only memory.

3. The biometric device of claim 1 wherein said non-volatile memory is selected from the group of electrically erasable programmable read only memory, flash memory, or programmable read only memory.

4. The biometric device of claim 1 further including an input/output section for programming said non-volatile memory.

5. The biometric device of claim 1 wherein said non-volatile memory is used to store a template that identifies an authorized individual.

6. The biometric device of claim 1 wherein said non-volatile memory stores a plurality of templates, each one of said plurality of templates identifying an authorized individual.

7. The biometric device of claim 6 wherein said non-volatile memory stores a pixel defect map.

8. A biometric device, comprising:

a CMOS image sensor formed on an integrated circuit, the CMOS image sensor configured to capture raw image data of a physiological characteristic of a candidate user;

non-volatile memory formed on the integrated circuit, the non-volatile memory capable to store a template that identifies an authorized user; and a microprocessor formed on the integrated circuit, the microprocessor capable to extract a feature set from the raw image data, to compare the feature set to the template, and to generate an unlock command if the feature set is substantially similar to the template.

* * * * *

UNITED STATES PATENT AND TRADEMARK OFFICE
CERTIFICATE OF CORRECTION

PATENT NO.    : 6,441,482 B1
DATED         : August 27, 2002
INVENTOR(S)   : Ronald R. Foster It is certified that error appears in the above-identified patent and that said Letters Patent is hereby corrected as shown below:

Column 4,
Line 23, "nonvolatile" should be -- non-volatile --;

Signed and Sealed this

Fourth Day of March, 2003

JAMES E. ROGAN
*Director of the United States Patent and Trademark Office*